(12) United States Patent
Nakamura

(10) Patent No.: US 7,696,069 B2
(45) Date of Patent: Apr. 13, 2010

(54) WAFER DIVIDING METHOD

(75) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 34 days.

(21) Appl. No.: 12/073,652

(22) Filed: Mar. 7, 2008

(65) Prior Publication Data
US 2008/0227272 A1 Sep. 18, 2008

(30) Foreign Application Priority Data
Mar. 14, 2007 (JP) ............................. 2007-065253

(51) Int. Cl.
*H01L 21/00* (2006.01)
(52) U.S. Cl. .................. 438/463; 438/460; 438/461; 438/462; 438/464; 257/E21.596; 257/E21.599
(58) Field of Classification Search ......... 438/460–464; 257/E21.596, 599
See application file for complete search history.

(56) References Cited

U.S. PATENT DOCUMENTS

2004/0072388 A1* 4/2004 Sekiya ....................... 438/113
2005/0090077 A1* 4/2005 Nagai et al. ................. 438/464
2007/0141810 A1* 6/2007 Nakamura .................. 438/460
2008/0268619 A1* 10/2008 Nakamura .................. 438/463

FOREIGN PATENT DOCUMENTS

JP 3408805 3/2003

* cited by examiner

*Primary Examiner*—Charles D Garber
*Assistant Examiner*—Yasser A Abdelaziez
(74) *Attorney, Agent, or Firm*—Smith, Gambrell & Russell, LLP

(57) ABSTRACT

Disclosed herein is a method of dividing a wafer having a plurality of streets which are formed in a lattice pattern on the front surface and having devices which are formed in a plurality of areas sectioned by the plurality of streets into individual devices along the streets. The method includes applying a laser beam of a wavelength having permeability for the wafer along the streets to form a deteriorated layer along the streets in the inside of the wafer; forming a groove in areas corresponding to the streets from the rear side of the wafer; and exerting external force to the wafer where the deteriorated layer and the groove have been formed along the streets to divide the wafer into individual devices along the streets.

3 Claims, 9 Drawing Sheets

(a)

(b)

(a)

(b)

WAFER DIVIDING METHOD

FIELD OF THE INVENTION

The present invention relates to a method of dividing a wafer having a plurality of streets which are formed in a lattice pattern on the front surface and devices which are formed in a plurality of areas sectioned by the plurality of streets, along the streets.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a device such as IC, LSI, liquid crystal driver or flash memory is formed in each of the sectioned areas. Individual devices are manufactured by cutting this semiconductor wafer along the streets to divide it into the areas each having a device formed thereon.

Cutting along the streets of the above semiconductor wafer is generally carried out by a cutting machine called "dicer". This cutting machine comprises a chuck table for holding a workpiece such as a semiconductor wafer or optical device wafer, a cutting means for cutting the workpiece held on the chuck table, and a cutting-feed means for moving the chuck table and the cutting means relative to each other. The cutting means comprises a rotary spindle, a cutting blade mounted on the rotary spindle and a drive mechanism for driving the rotary spindle. The cutting blade comprises a disk-like base and an annular cutting edge which is mounted on the side wall of the base and formed as thick as about 20 μm by fixing diamond abrasive grains having a diameter of about 3 μm to the base by electroforming.

Since the cutting blade has a thickness of about 20 μm, however, the streets for sectioning devices must have a width of about 50 μm. Therefore, there is a problem in that the area ratio of the streets to the wafer becomes large, thereby reducing productivity.

Meanwhile, as a means of dividing a plate-like workpiece such as a semiconductor wafer, a laser processing method in which a pulse laser beam having permeability for the workpiece is applied with its focusing point set to the inside of the area to be divided is attempted and disclosed, for example, by Japanese Patent No. 3408805. In the dividing method making use of this laser processing technique, the workpiece is divided by applying a pulse laser beam of a wavelength having permeability for the workpiece from one surface side of the workpiece with its focusing point set to the inside to continuously form a deteriorated layer along the streets in the inside of the workpiece and exerting external force along the streets whose strength has been reduced by the formation of the deteriorated layers. This method makes it possible to reduce the width of the streets.

In a wafer having liquid crystal drivers or flash memories which are relatively thick (for example, 300 μm), the deteriorated layer may be formed from the front surface to the rear surface of the wafer to facilitate division along the streets where the deteriorated layer is formed, in some cases. When the deteriorated layer is formed thus from the front surface to the rear surface of the wafer, the deteriorated layer remains on all the side faces of the obtained devices, whereby a problem will occur that the deflective strength of each device is greatly reduced especially by the deteriorated layer remaining on the rear surface and consequently, the device is damaged in the subsequent step or after it become a product.

SUMMARY OF THE INVENTION

It is an object of the present invention to provide a method of dividing a wafer into individual devices along streets where a deteriorated layer has been formed by applying a pulse laser beam along the streets of the wafer, without reducing the deflective strength of the devices.

According to the present invention, the above object is attained by a method of dividing a wafer having a plurality of streets which are formed in a lattice pattern on the front surface and having devices which are formed in a plurality of areas sectioned by the plurality of streets, into individual devices along the streets, the method comprising:

a deteriorated layer forming step for applying a laser beam of a wavelength having permeability for the wafer along the streets to form a deteriorated layer along the streets in the inside of the wafer;

a groove forming step for forming a groove in areas corresponding to the streets from the rear side of the wafer; and a wafer dividing step for exerting external force to the wafer where the deteriorated layer and the groove have been formed along the streets to divide the wafer into individual devices along the streets where the deteriorated layer and the groove have been formed.

Desirably, the deteriorated layer is formed to a depth of at least 20 μm from the front surface of the wafer in the deteriorated layer forming step, the groove having a depth of at least 50 μm from the rear surface of the wafer is formed so as to expose the deteriorated layer to the bottom of the groove in the groove forming step.

Further, it is desired to apply a laser beam from the rear surface of the wafer in the deteriorated layer forming step.

The groove is formed by a cutting machine in the groove forming step.

According to the wafer dividing method of the present invention, the step of forming a deteriorated layer along the streets in the inside of the wafer by applying a laser beam of a wavelength having permeability for the wafer along the streets is followed by the step of forming a groove in the areas corresponding to the streets from the rear side of the wafer. Therefore, as individual devices obtained by dividing the wafer along the streets have no deteriorated layer in the areas corresponding to the depth of the grooves, the deflective strength of the devices is not reduced. Further, according to the wafer dividing method of the present invention, since the deteriorated layer is formed along the streets on the front surface side of the wafer and the wafer is then divided along the deteriorated layers, the width of the streets can be reduced.

BRIEF DESCRIPTION OF THE DRAWINGS

FIG. 5(b) is an enlarged sectional view of the semiconductor wafer which has undergone the groove forming step;

DETAILED DESCRIPTION OF THE PREFERRED EMBODIMENTS

Preferred embodiments of the present invention will be described in detail hereinunder with reference to the accompanying drawings.

Figure 1:
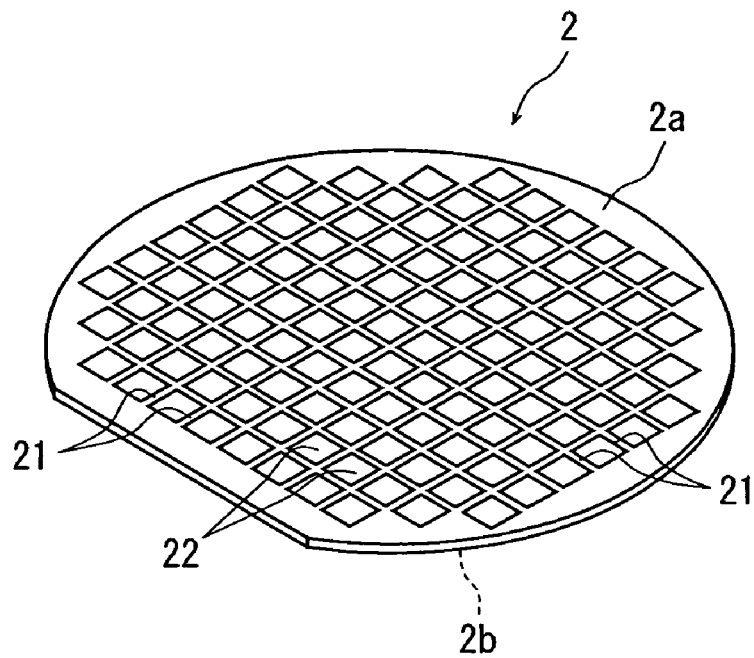
FIG. 1 is a perspective view of a semiconductor wafer to be divided by the wafer dividing method of the present invention.

FIG. 1 is a perspective view of a semiconductor wafer as a wafer to be processed according to the present invention. The semiconductor wafer 2 shown in FIG. 1 is, for example, a silicon wafer having a thickness of 300 μm, and a device 22 such as IC, LSI, liquid crystal driver or flash memory is formed in a plurality of areas sectioned by a plurality of streets 21 arranged in a lattice pattern on the front surface 2a. A description will be subsequently given of the method of dividing this semiconductor wafer 2 into individual devices 22 (chips).

Figure 2:
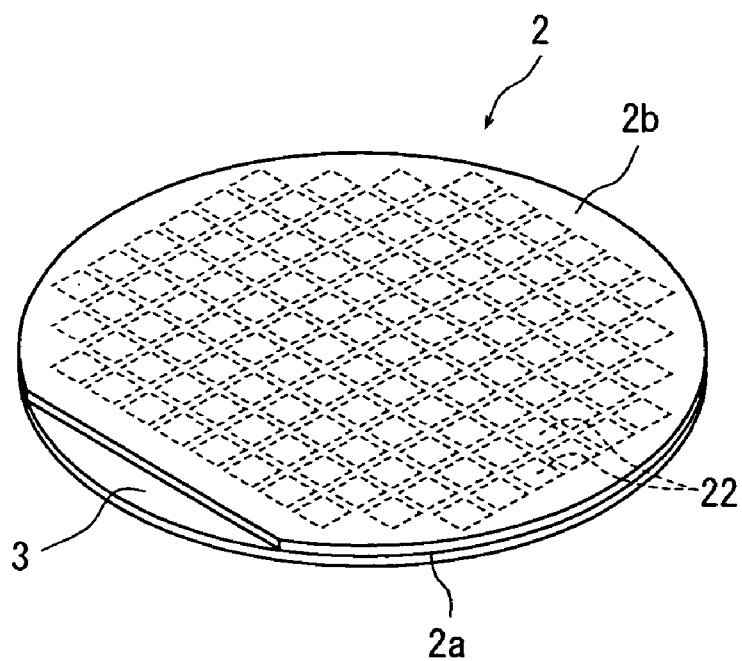
FIG. 2 is a perspective view showing a state of a protective member being put on the front surface of the semiconductor wafer shown in FIG. 1.

A protective member 3 is affixed to the front surface 2a of the above semiconductor wafer 2 as shown in FIG. 2 to protect the devices 22 (protective member affixing step).

After the protective member 3 is affixed to the front surface 2a of the semiconductor wafer 2 by carrying out the protective member affixing step, next comes the step of forming a deteriorated layer along the streets 21 in the inside of the semiconductor wafer 2 by applying a laser beam of a wavelength having permeability for the semiconductor wafer 2 along the streets 21. This deteriorated layer forming step is carried out by using a laser beam processing machine shown in FIG. 3 in the illustrated embodiment. The laser beam processing machine 4 shown in FIG. 3 comprises a chuck table 41 for holding a workpiece, a laser beam application means 42 for applying a laser beam to the workpiece held on the chuck table 41, and an image pick-up means 43 for picking up an image of the workpiece held on the chuck table 41. The chuck table 41 is so constituted as to suction-hold the workpiece and is designed to be moved in a processing-feed direction indicated by an arrow X in FIG. 3 and an indexing-feed direction indicated by an arrow Y by a moving mechanism that is not shown.

The above laser beam application means 42 has a cylindrical casing 421 arranged substantially horizontally. In the casing 421, there is installed a pulse laser beam oscillation means comprising a pulse laser beam oscillator composed of a YAG laser oscillator or YVO4 laser oscillator and a repetition frequency setting means, which are not shown. A condenser 422 for converging a pulse laser beam oscillated from the pulse laser beam oscillation means is mounted on the end of the above casing 421.

The image pick-up means 43 mounted on the end portion of the casing 421 constituting the above laser beam application means 42 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is supplied to a control means that is not shown.

Figure 3:
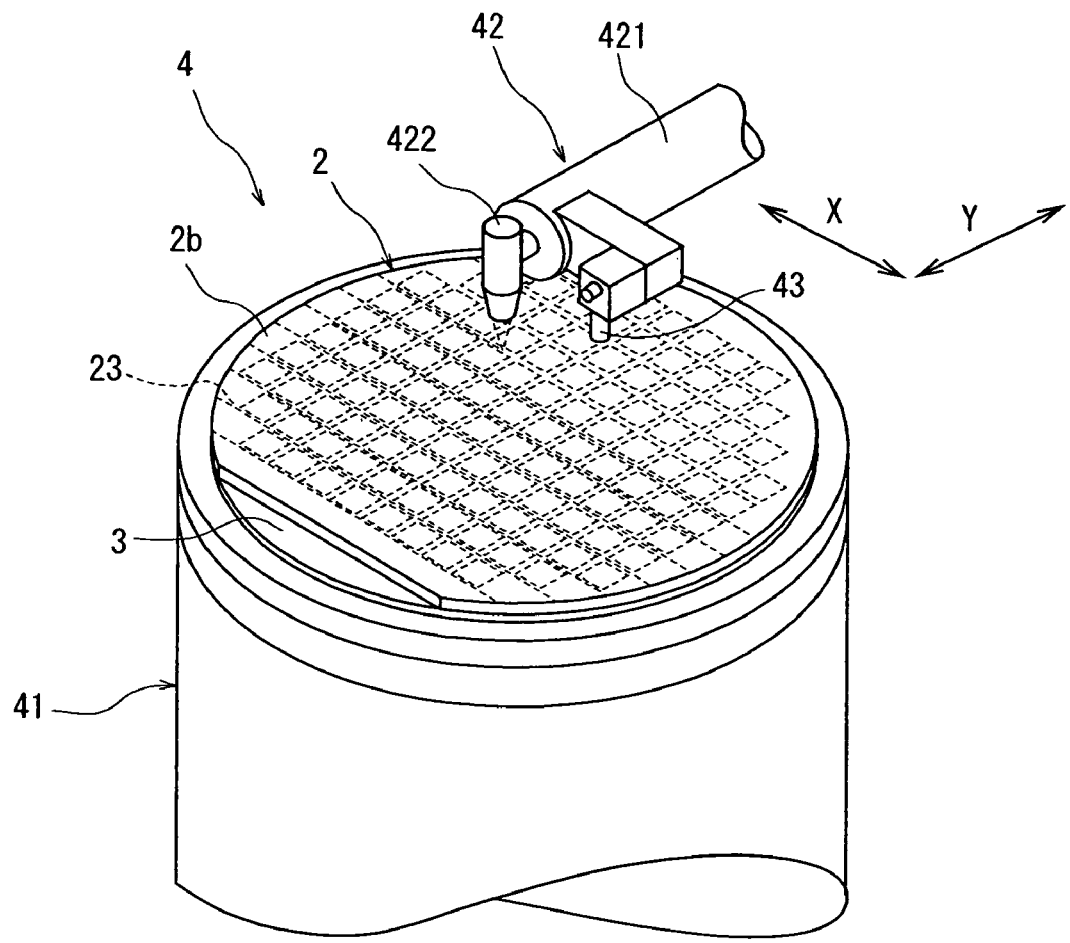
FIG. 3 is a perspective view of the principle portion of a laser beam processing machine for carrying out a deteriorated layer forming step in the wafer dividing method of the present invention.

To carry out the deteriorated layer forming step by using the above-described laser beam processing machine 4, the protective member 3 side of the semiconductor wafer 2 is placed on the chuck table 41 of the laser beam processing machine 4, as shown in FIG. 3. The semiconductor wafer 2 is then suction-held on the chuck table 41 by a suction means (not shown) (wafer holding step). Therefore, the rear surface 2b of the semiconductor wafer 2 suction-held on the chuck table 41 faces up. Since the rear surface 2b of the semiconductor wafer 2 has been polished and so a laser beam of a wavelength having permeability easily goes into the rear surface 2b, a laser beam is preferably applied from the rear surface 2b. In the case, however, when there is no metal film on the streets 21, a laser beam may be applied from the front surface 2a to form a deteriorated layer.

The above wafer holding step is followed by the step of forming a deteriorated layer along the streets 21 in the inside of the semiconductor wafer 2 by applying a pulse laser beam of a wavelength having permeability for the silicon wafer constituting the semiconductor wafer 2 from the rear surface 2b of the semiconductor wafer 2 along the streets 21. To carry out the deteriorated layer forming step, the chuck table 41 suction-holding the semiconductor wafer 2 is first brought at a position right below the image pick-up means 43 by the moving mechanism that is not shown. Then, alignment work for detecting the area to be processed of the semiconductor wafer 2 is carried out by the image pick-up means 43 and the control means that is not shown. That is, the image pick-up means 43 and the control means (not shown) carry out image processing such as pattern matching, etc. to align a street 21 formed in a predetermined direction of the semiconductor wafer 2 with the condenser 422 of the laser beam application means 42 for applying a laser beam along the street 21, thereby performing the alignment of a laser beam application position. The alignment of the laser beam application position is also carried out on streets 21 formed on the semiconductor wafer 2 in a direction perpendicular to the above predetermined direction (aligning step). Although the front surface 2a, on which the street 21 is formed, of the semiconductor wafer 2 faces down at this point, as the image pick-up means 43 comprises an infrared illuminating means, an optical system for capturing infrared radiation and an image pick-up device (infrared CCD) for outputting an electric signal corresponding to the infrared radiation as described above, an image of the street 21 can be picked up through the rear surface 2b.

Figure 4:
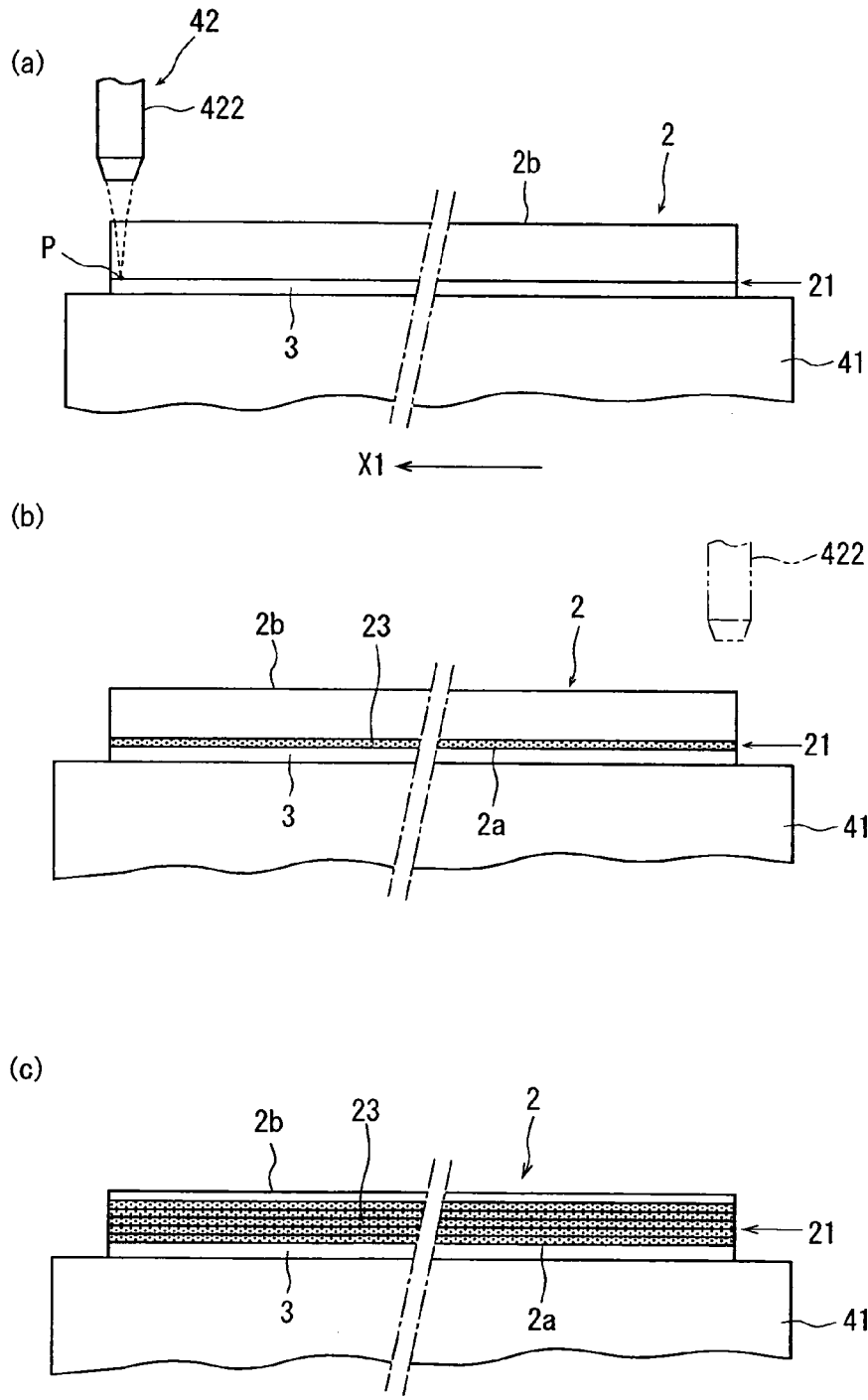
FIGS. 4($a$) to 4($c$) are explanatory diagrams showing the deteriorated layer forming step in the wafer dividing method of the present invention.

After the aligning step has been carried out as described above, the chuck table 41 is moved to a laser beam application area where the condenser 422 of the laser beam application means 42 for applying a laser beam is located as shown in FIG. 4(a) to bring one end (left end in FIG. 4(a)) of the predetermined street 21 to a position right below the condenser 422 of the laser beam application means 42. The chuck table 41 is then moved in the direction shown by the arrow X1 in FIG. 4(a) at a predetermined feed rate while a pulse laser beam having permeability for the silicon wafer is applied from the condenser 422. When the application position of the condenser 422 reaches the other end of the street 21 as shown in FIG. 4(b), the application of the pulse laser beam is suspended and the movement of the chuck table 41 is stopped. In this deteriorated layer forming step, the focusing point P of the pulse laser beam is set to a position near the front surface 2a (undersurface) of the semiconductor wafer 2. As a result, a deteriorated layer 23 is exposed to the front surface 2a (undersurface) of the semiconductor wafer 2 and formed from the front surface 2a toward the inside. This deteriorated layer 23 is formed as a molten and re-solidified layer. In the deteriorated layer forming step, a pulse laser beam is preferably applied from the rear surface 2b side of the semiconductor wafer 2 as described above. That is, as the rear surface 2b of the semiconductor wafer 2 is flat and polished like a mirror surface, the pulse laser beam is not reflected diffusely and its focusing point can be set to a predetermined position accurately.

The processing conditions in the above deteriorated layer forming step are set as follows, for example.

Light source: LD excited Q switch Nd:YVO4 pulse laser
Wavelength: 1,064 nm
Repetition frequency: 100 kHz
Pulse output: 10 μJ
Focusing spot diameter: 1 μm
Processing-feed rate: 100 mm/sec Since the thickness of the deteriorated layer 23 formed once under the above processing conditions is about 50 μm, deteriorated layers 23 can be formed from the front surface 2a up to the rear surface 2b along the street 21 in the inside of the semiconductor wafer 2 having a thickness of 300 μm by carrying out the above deteriorated layer forming step 6 times, for example. Since a groove having a depth of at least 50 μm will be formed in areas corresponding to the streets 21 on the rear surface 2b of the semiconductor wafer 2 as described later, the deteriorated layer 23 is desirably formed from the rear surface 2b up to a position of at least 50 μm, as shown in FIG. 4(c). Although it is preferred that deteriorated layers be formed from the front surface 2a up to the rear surface 2b of the semiconductor wafer 2, even when deteriorated layers are not formed to a depth of 10 to 20 μm from the front surface 2a or the rear surface 2b, if deteriorated layers accounting for 80% of the thickness of the wafer are formed, the wafer can be divided into individual devices. The semiconductor wafer 2 has a device layer having a thickness of about 10 μm laminated on the front surface of a silicon substrate. Even when the deteriorated layer is formed in the device layer, the brittleness of the device layer is low and the deflective strength is not reduced if the deteriorated layer remains. However, silicon has high brittleness and hence, the deflective strength is reduced if the deteriorated layer remains on the rear surface.

After the deteriorated layer forming step is carried out along all the streets 21 extending in the predetermined direction of the semiconductor wafer 2 as described above, the chuck table 41 is turned at 90° to carry out the above deteriorated layer forming step along streets 21 extending in a direction perpendicular to the above predetermined direction.

The deteriorated layer forming step is followed by the step of forming a groove in areas corresponding to the streets 21 from the rear surface 2b of the semiconductor wafer 2. A first embodiment of this groove forming step is carried out by using a cutting machine 5 shown in FIG. 5(a). The cutting machine 5 shown in FIG. 5(a) comprises a chuck table 51 having a suction-holding means, a cutting means 52 having a cutting blade 521, and an image pick-up means 53. To carry out the groove forming step, the front surface 2a side of the semiconductor wafer 2 which has undergone the above deteriorated layer forming step is placed on the chuck table 51. Therefore, the rear surface 2b of the semiconductor wafer 2 faces up. By activating a suction means (not shown), the semiconductor wafer 2 is held on the chuck table 51. The chuck table thus suction-holding the semiconductor wafer 2 is brought to a position right below the image pick-up means 53 by a cutting-feed mechanism that is not shown.

After the chuck table 51 is positioned right below the image pick-up means 53, alignment work for detecting the area to be processed of the semiconductor wafer 2 is carried out by the image pick-up means 53 and a control means that is not shown. That is, the image pick-up means 53 and the control means (not shown) carry out image processing such as pattern matching, etc. to align a street 21 formed in a predetermined direction of the semiconductor wafer 2 with the cutting blade 521, thereby performing the alignment of a cutting area (aligning step). The alignment of the cutting area is also carried out on streets 21 formed on the semiconductor wafer 2 in a direction perpendicular to the above predetermined direction. Although the front surface 2a, on which the streets 21 are formed, of the semiconductor wafer 2 faces down at this point, as the image pick-up means 53 comprises an infrared illuminating means, an optical system for capturing infrared radiation and an image pick-up device (infrared CCD) for outputting an electric signal corresponding to the infrared radiation, an image of the street 21 can be picked up through the rear surface 2b.

Figure 5:
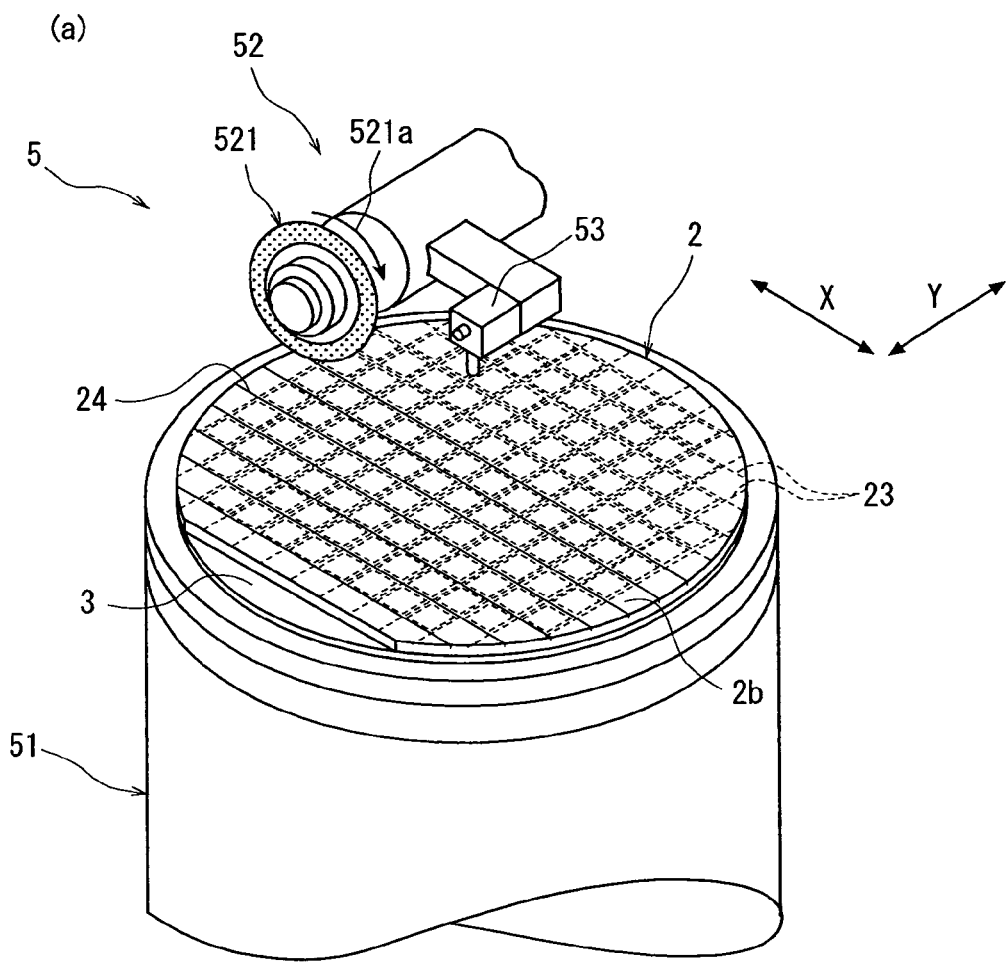
FIGS. 5($a$) and 5($b$) are diagrams showing a first embodiment of a groove forming step in the wafer dividing method of the present invention, wherein FIG. 5($a$) is a perspective view of a cutting machine for carrying out the grove forming step
Figure 5:
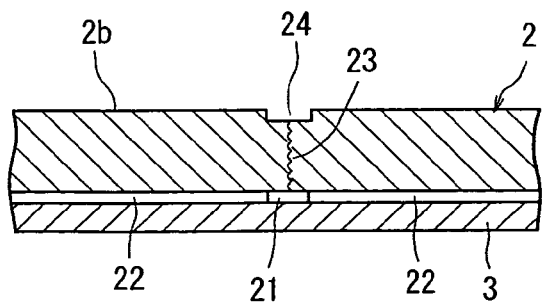
Figure 6:
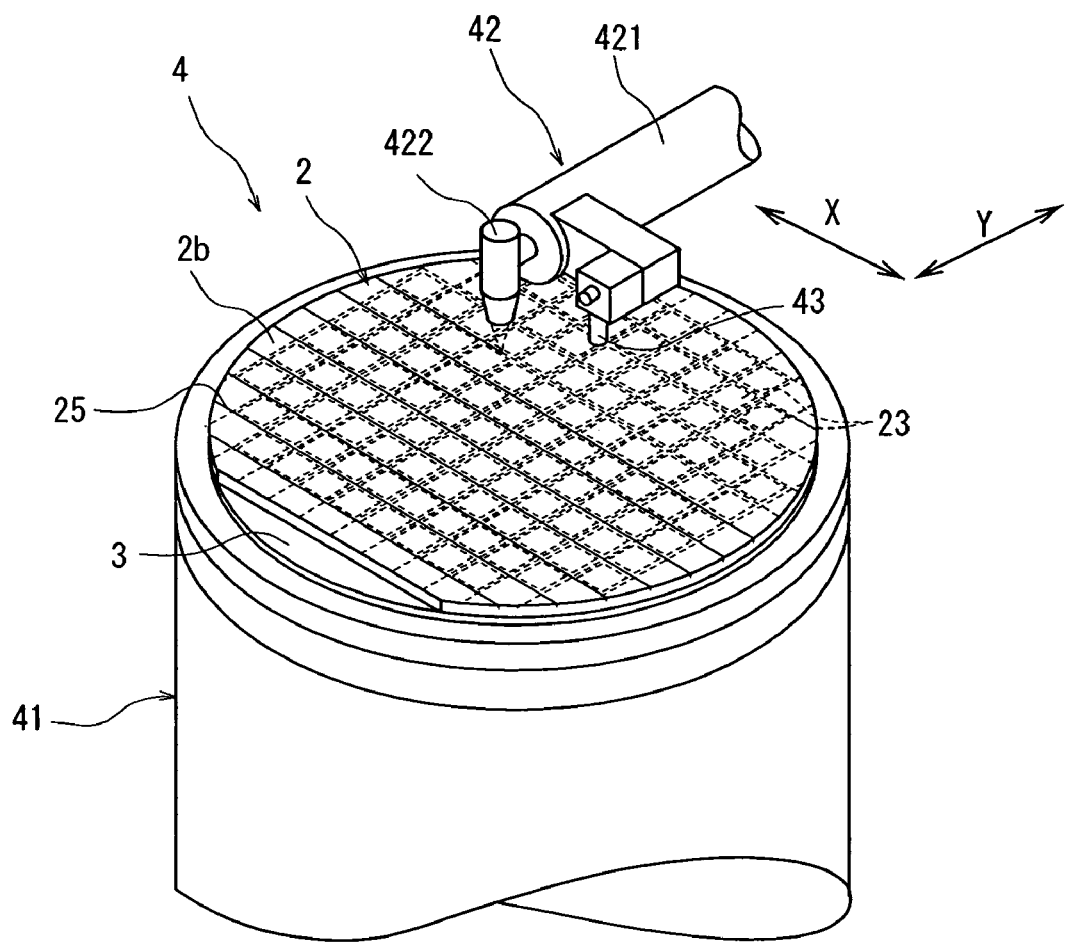
FIG. 6 is a perspective view of a laser beam processing machine for carrying out a second embodiment of the groove forming step in the wafer dividing method of the present invention.

After the alignment of the cutting area of the semiconductor wafer 2 held on the chuck table 51 is carried out as described above, the chuck table 51 holding the semiconductor wafer 2 is moved to the cutting start position of the cutting area. The cutting blade 521 is then moved down a predetermined distance while it is rotated, in the cutting-in feed direction indicated by the arrow 521a in FIG. 5(a). This cutting-in feed position is set to a position where the periphery of the cutting blade 521 is located at a depth of at least 50 μm from the rear surface 2b (top surface) of the semiconductor wafer 2. After the cutting blade 521 is moved down as described above, the chuck table 51 is moved (cutting-fed) in the direction indicated by the arrow X in FIG. 5(a) while the cutting blade 521 is rotated, to form a cut groove 24 along the street 21 in the rear surface 2b of the semiconductor wafer 2, as shown in FIG. 5(b) (groove forming step). The depth of the cut groove 24 must be at least 50 μm in order to prevent a reduction in the deflective strength of the individually divided devices 22 as will be described later. To divide the semiconductor wafer 2 along the streets 21 where the above deteriorated layer 23 has been formed, accurately and easily as will be described later, the deteriorated layer 23 is desirably exposed to the bottom of the cut groove 24.

The above groove forming step is carried out on the areas corresponding to all the streets 21.

A description will be subsequently given of a second embodiment of the groove forming step with reference to FIG. 6 and FIGS. 7(a) to 7(c).

The second embodiment of the groove forming step is carried out by using a laser beam processing machine similar to the above laser beam processing machine 4 shown in FIG. 3. Therefore, the reference symbols of the members of the laser beam processing machine are the same as those of the laser beam processing machine 4 shown in FIG. 3.

The protective member 3 side of the semiconductor wafer 2 which has undergone the above deteriorated layer forming step is placed on the chuck table 41. Then, the semiconductor wafer 2 is suction-held on the chuck table 41 by the suction means that is not shown (wafer holding step). Therefore, the rear surface 2b of the semiconductor wafer 2 suction-held on the chuck table 41 faces up. The wafer holding step is followed by the above aligning step.

Figure 7:
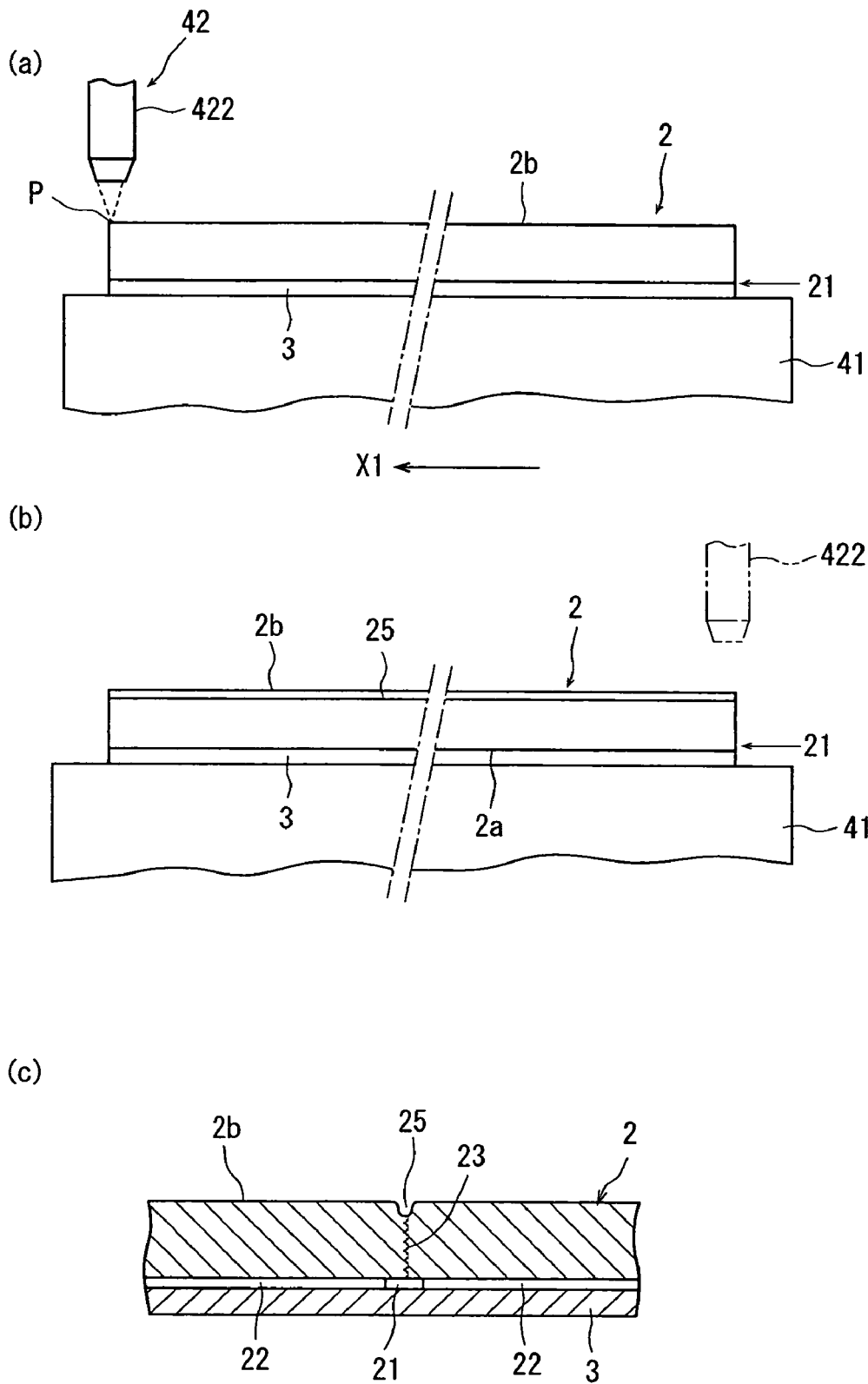
FIGS. 7(a) to 7(c) are explanatory diagrams showing the second embodiment of the groove forming step in the wafer dividing method of the present invention.

Next, the chuck table 41 is moved to a laser beam application area where the condenser 422 of the laser beam application means 42 for applying a laser beam is located as shown in FIG. 7(a) so as to bring one end (left end in FIG. 7(a)) of a predetermined street 21 to a position right below the condenser 422 of the laser beam application means 42. The chuck table 41, that is, the semiconductor wafer 2 is then moved in the direction indicated by the arrow X1 in FIG. 7(a) at a predetermined processing-feed rate while a pulse laser beam of a wavelength having absorptivity for the silicon wafer is applied from the condenser 422 of the laser beam application means 42 (laser-processing groove forming step). When the other end (right end in FIG. 7(b)) of the street 21 reaches a position right below the condenser 422 as shown in FIG. 7(b), the application of the pulse laser beam is suspended and the movement of the chuck table 41, that is, the semiconductor wafer 2 is stopped. In this laser-processing groove forming step, the focusing point P of the pulse laser beam is set to a position near the rear surface 2b (top surface) of the semiconductor wafer 2.

By the above laser-processing groove forming step, the ablation processing of the area corresponding to the street 21 of the rear surface 2b of the semiconductor wafer 2 is carried out, and a laser-processed groove 25 is formed as shown in FIGS. 7(b) and 7(c). This laser-processed groove 25 has a depth of at least 50 μm like the above cut groove 24 so that the deteriorated layer 23 is exposed to the bottom of the laser-processed groove 25. The inventors of the present invention have confirmed that, when the groove is formed through ablation processing by applying a laser beam of a wavelength having absorptivity for the wafer, the deflective strength is not reduced by the sublimation of silicon.

The above laser-processing groove forming step is carried out under the following processing conditions, for example.

Light source: YVO4 laser or YAG laser
Wavelength: 355 nm or 266 nm
Repetition frequency: 50 kHz
pulse width: 0.1 ns
Focal spot: elliptic, long axis: 200 μm, short axis: 10 μm
Processing-feed rate: 150 mm/sec After the above laser-processing groove forming step is carried out along all the streets 21 extending in the predetermined direction of the semiconductor wafer 2, the chuck table 41 is turned at 90° to carry out the above laser-processing groove forming step along streets 21 extending in a direction perpendicular to the above predetermined direction.

The step of forming a groove in the areas corresponding to the streets 21 from the rear surface 2b of the semiconductor wafer 2 may be carried out by dry etching or wet etching.

Figure 8:
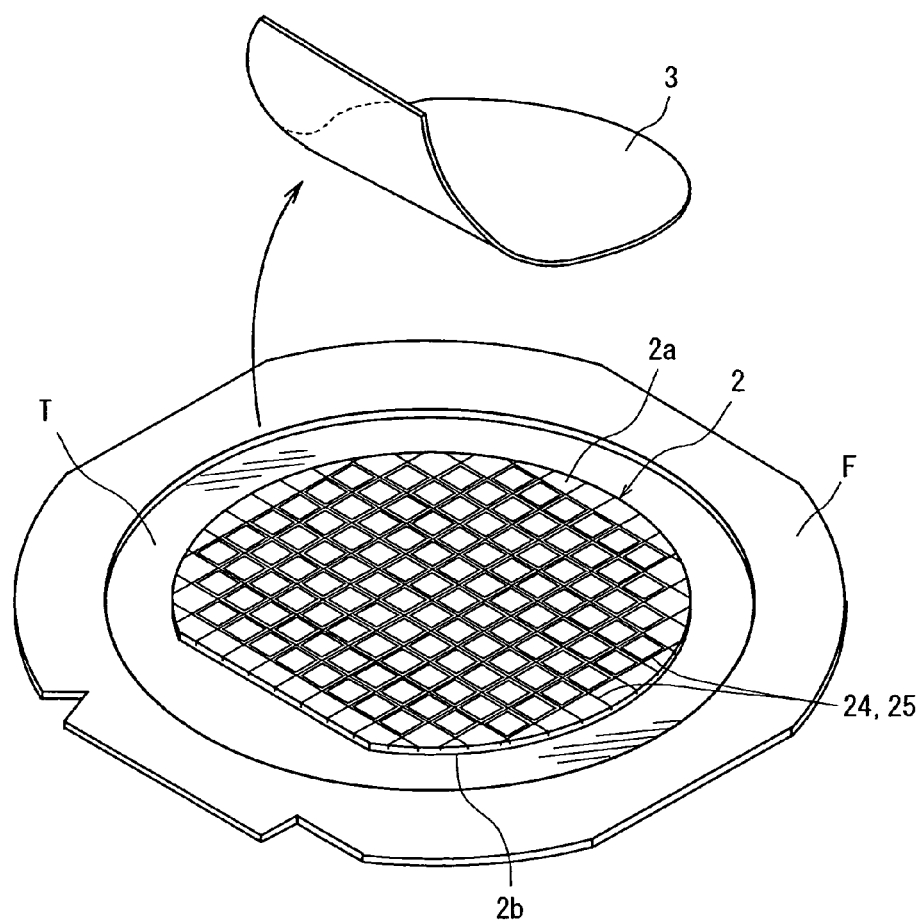
FIG. 8 is an explanatory diagram showing a wafer supporting step and a protective member removing step in the wafer dividing method of the present invention.

After the above groove forming step, next comes the wafer supporting step for affixing the rear surface 2b of the semiconductor wafer 2 to the front surface of a dicing tape T mounted on an annular frame F, as shown in FIG. 8. Then, the protective member 3 affixed to the front surface 2a of the semiconductor wafer 2 is removed (protective member removing step).

Figure 9:
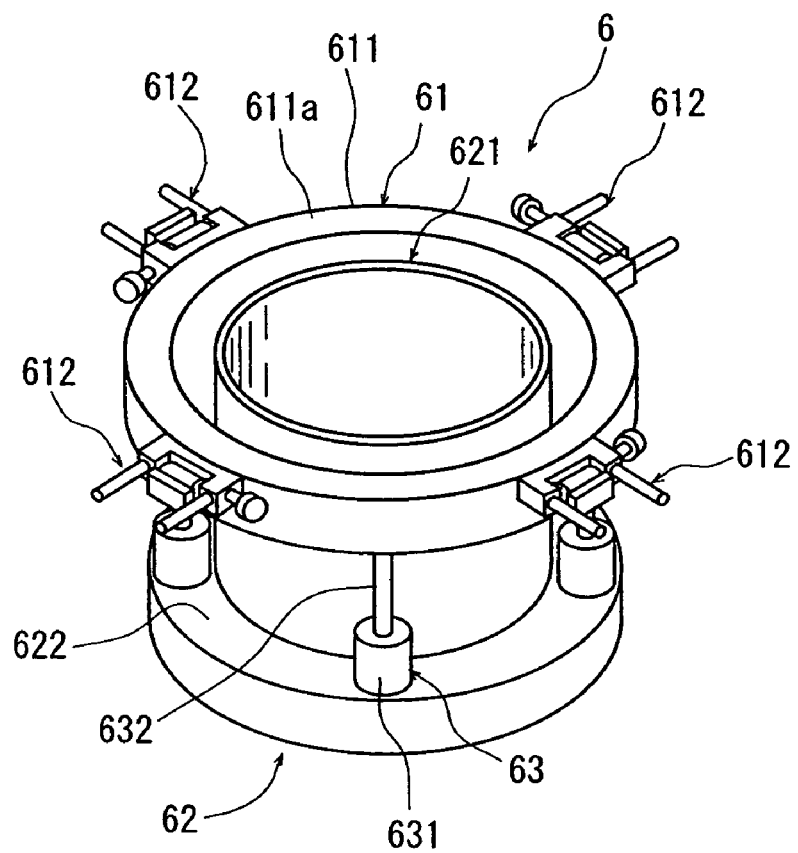
FIG. 9 is a perspective view of an embodiment of a dividing machine for carrying out a wafer dividing step in the wafer dividing method of the present invention.

Next comes the wafer dividing step for dividing the semiconductor wafer 2 into individual devices 22 along the streets 21 where the deteriorated layer 23 and the cut groove 24 or the laser-processed groove 25 have been formed by exerting external force to the semiconductor wafer 2 where the deteriorated layer 23 and the cut groove 24 or the laser-processed groove 25 have been formed along the streets 21. This wafer dividing step is carried out by using a dividing machine 6 shown in FIG. 9. This dividing machine 6 shown in FIG. 9 has a frame holding means 61 for holding the above annular frame F and a tape expanding means 62 for expanding the dicing tape T mounted on the annular frame F held on the frame holding means 61. The frame holding means 61 comprises an annular frame holding member 611 and a plurality of clamps 612 as a fixing means arranged around the frame holding member 611. The top surface of the frame holding member 611 forms a placing surface 611a for placing the annular frame F, and the annular frame F is placed on this placing surface 611a. The annular frame F placed on the placing surface 611a is fixed on the frame holding member 611 by the clamps 612. The thus constituted frame holding means 61 is supported by the tape expanding means 62 in such a manner that it can move in the vertical direction.

The tape expanding means 62 comprises an expansion drum 621 that is arranged within the above annular frame holding member 611. This expansion drum 621 has a smaller outer diameter than the inner diameter of the annular frame F and a larger inner diameter than the outer diameter of the semiconductor wafer 2 on the dicing tape T mounted on the annular frame F. The expansion drum 621 has a support flange 622 at the lower end. The tape expanding means 62 in the illustrated embodiment has a support means 63 which can move the above annular frame holding member 611 in the vertical direction. This support means 63 is composed of a plurality of air cylinders 631 installed on the above support flange 622, and their piston rods 632 are connected to the undersurface of the above annular frame holding member 611. The support means 63 composed of the plurality of air cylinders 631 moves the annular frame holding member 611 in the vertical direction between a standard position where the placing surface 611a becomes substantially flush with the upper end of the expansion drum 621 and an expansion position where the placing surface 611a is positioned below the upper end of the expansion drum 621 by a predetermined distance. Therefore, the support means 63 composed of the plurality of air cylinders 631 functions as an expanding and moving means for moving the annular frame holding member 611 relative to the expansion drum 621 in the vertical direction.

Figure 10:
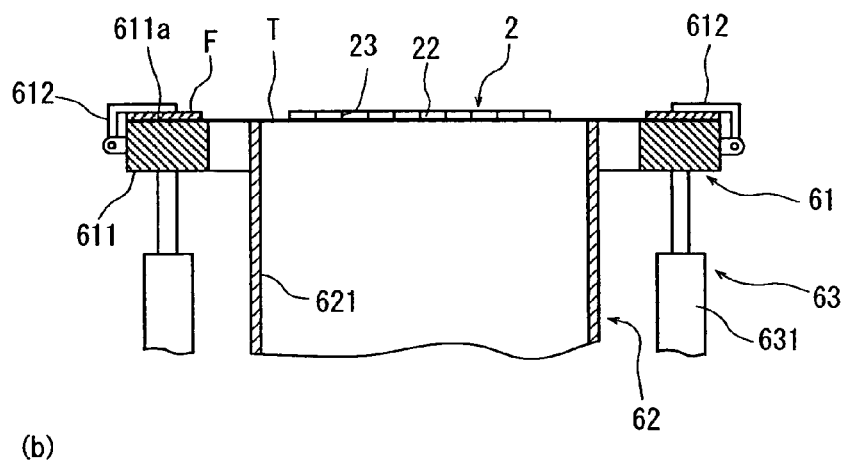
FIGS. 10(a) and 10(b) are explanatory diagrams showing the wafer dividing step in the wafer dividing method of the present invention.
Figure 10:
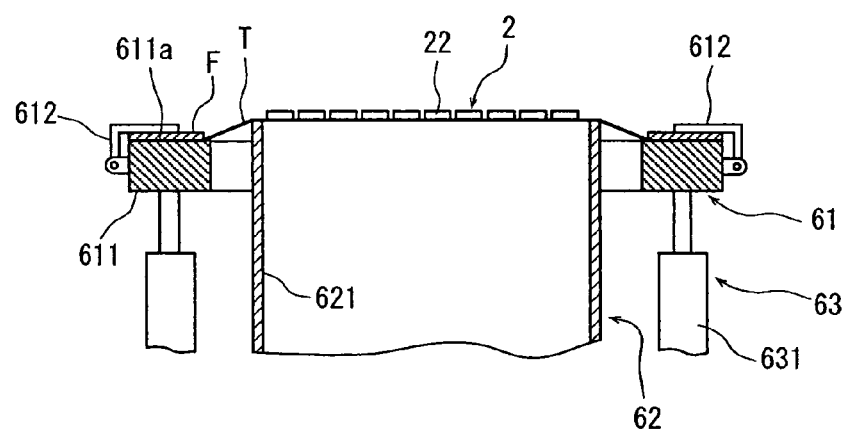

The wafer dividing step which is carried out by using the dividing machine 6 constituted as described above will be described with reference to FIGS. 10(a) and 10(b). That is, the annular frame F, on which the dicing tape T affixed to the rear surface 2b of the semiconductor wafer 2 (the deteriorated layer 23 and the cut groove 24 or the laser-processed groove 25 have been formed along the streets 21) is mounted, is placed on the placing surface 611a of the frame holding member 611 constituting the frame holding means 61 and fixed on the frame holding member 611 by the clamps 612 as shown in FIG. 10(a). At this point, the frame holding member 611 is situated at the standard position shown in FIG. 10(a). The annular frame holding member 611 is then lowered to the expansion position shown in FIG. 10(b) by activating the plurality of air cylinders 631 as the support means 63 constituting the tape expanding means 62. Therefore, the annular frame F fixed on the placing surface 611a of the frame holding member 611 is also lowered, whereby the dicing tape T mounted on the annular frame F is brought into contact with the upper edge of the expansion drum 621 and expanded as shown in FIG. 10(b). As a result, tensile force is applied radially to the semiconductor wafer 2 on the dicing tape T, whereby the semiconductor wafer 2 is divided into individual devices 22 along the streets 101 whose strength has been reduced by the formation of the deteriorated layers 23. Although the above semiconductor wafer 2 has a relatively large thickness of 300 μm, as the deteriorated layers 23 are formed from the front surface to the rear surface (the bottom of the cut groove 24 or the laser-processed groove 25) along the streets 21, the semiconductor wafer 2 can be divided into individual devices 22 accurately and easily by carrying out the above wafer dividing step.

Figure 11:
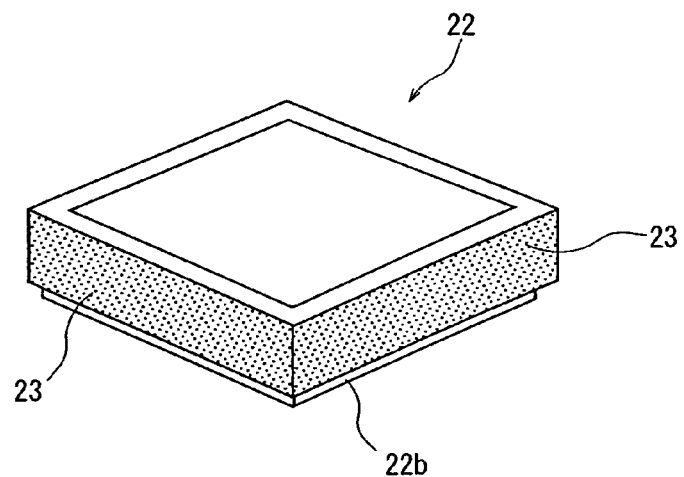
FIG. 11 is a perspective view of a device obtained by the wafer dividing method of the present invention.

Since the individual device 22 obtained as described above has no deteriorated layer 23 on the side face on the rear surface 22b side, as shown in FIG. 11, its deflective strength does not lower. According to experiments conducted by the inventors of the present invention, a silicon wafer having a diameter of 200 mm and a thickness of 300 μm was divided by the above-described dividing method to manufacture chips having a width of 10 mm, a length of 10 mm, a thickness of 300 μm and a thickness of the area devoid of the deteriorated layer 23 on the side face on the rear side of 50 μm. When the deflective strength of each of the chips was measured by a 3-point bending test, it was 700 MPa or more. Thus, it was confirmed that the chip was satisfactory as a product. When the deteriorated layer was formed on all the side faces of the device, the deflective strength of the device was 300 MPa or less.

What is claimed is:

1. A method of dividing a wafer having a plurality of streets which are formed in a lattice pattern on the front surface and devices which are formed in a plurality of areas sectioned by the plurality of streets into individual devices along the streets, the method comprising:

a deteriorated layer forming step for applying a laser beam of a wavelength having permeability for the wafer, said laser beam being applied from the rear surface of the wafer along the streets to form a deteriorated layer, along the streets, in the inside of the wafer;

a groove forming step for forming a groove in areas corresponding to the streets from the rear side of the wafer so that the deteriorated layer is exposed to the bottom of the groove; and a wafer dividing step for exerting external force to the wafer where the deteriorated layer and the groove have been formed to divide the wafer into individual devices along the streets where the deteriorated layer and the groove have been formed.

2. The wafer dividing method according to claim 1, wherein the groove is formed by a cutting machine in the groove forming step.

3. The wafer dividing method according to claim 1, wherein the groove is formed by applyig a laser beam in the groove forming step.

\* \* \* \* \*